(12) United States Patent
Fastow et al.

(10) Patent No.: US 6,996,004 B1
(45) Date of Patent: Feb. 7, 2006

(54) MINIMIZATION OF FG-FG COUPLING IN FLASH MEMORY

(75) Inventors: Richard Fastow, Cupertino, CA (US); Sheunghee Park, Pleasanton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 85 days.

(21) Appl. No.: 10/700,414

(22) Filed: Nov. 4, 2003

(51) Int. Cl.
*G11C 16/04* (2006.01)

(52) U.S. Cl. .......................... 365/185.03; 365/185.24; 365/185.22

(58) Field of Classification Search ........... 365/185.03, 365/185.24, 185.22, 195.33, 185.19
See application file for complete search history.

(56) References Cited

U.S. PATENT DOCUMENTS

| | | | |
|---|---|---|---|
| 6,456,528 B1 * | 9/2002 | Chen ..................... | 365/185.03 |
| 6,542,407 B1 * | 4/2003 | Chen et al. ............. | 365/185.17 |
| 6,847,553 B2 * | 1/2005 | Chen et al. ............. | 365/185.09 |
| 2003/0137888 A1 * | 7/2003 | Chen et al. ................. | 365/200 |
| 2003/0214853 A1 * | 11/2003 | Hosono et al. ............. | 365/200 |
| 2005/0024943 A1 * | 2/2005 | Chen et al. ............. | 365/185.22 |

\* cited by examiner

*Primary Examiner*—Thong Q. Le
(74) *Attorney, Agent, or Firm*—Monica H. Choi

(57) ABSTRACT

Multiple passes of the loop of program verify and programming steps are performed for minimizing the effects of FG—FG coupling during programming a flash memory device. In one embodiment of the present invention, for programming a group of at least one flash memory cell of an array, a first pass of program verify and programming steps is performed until each flash memory cell of the group attains a threshold voltage that is at least X % of a program verify level but less than the program verify level. Then, a second pass of program verify and programming steps are performed until each flash memory cell of the group attains substantially the program verify level for the threshold voltage.

18 Claims, 8 Drawing Sheets

MINIMIZATION OF FG-FG COUPLING IN FLASH MEMORY

TECHNICAL FIELD

The present invention relates generally to flash memory technology, and more particularly, to a method and system for minimizing FG—FG (floating gate to floating gate) coupling during programming.

BACKGROUND OF THE INVENTION

Referring to FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a semiconductor substrate or a p-well 103. In addition, a floating gate structure 104, comprised of a conductive material such as polysilicon for example, is disposed over the tunnel dielectric structure 102. A control dielectric structure 106, typically comprised of silicon dioxide ($SiO_2$) and silicon nitride ($Si_3N_4$), such as an ONO (oxide-nitride-oxide) structure for example, is disposed over the floating gate structure 104. A control gate structure 108, comprised of a conductive material, is disposed over the control dielectric structure 106.

A drain bit-line junction 110 that is doped with a junction dopant, such as arsenic (As) or phosphorous (P) for example, is formed within an active device area 112 of the semiconductor substrate or p-well 103 toward a left sidewall of the floating gate structure 104 in FIG. 1. A source bit-line junction 114 that is doped with the junction dopant is formed within the active device area 112 of the semiconductor substrate or p-well 103 toward a right sidewall of the floating gate structure 104 of FIG. 1.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of flash memory technology.

For example, during programming of the flash memory cell 100 that is an N-channel flash memory cell, electrons are injected into the floating gate structure 104 to increase the threshold voltage of the flash memory cell 100. Alternatively, during erasing of the N-channel flash memory cell 100, electrons are pulled out of the floating gate structure 104 to the substrate or p-well 103 to decrease the threshold voltage of the flash memory cell 100.

FIG. 2 illustrates a circuit diagram representation of the flash memory cell 100 of FIG. 1 including a control gate terminal 120 coupled to the control gate structure 108, a drain terminal 122 coupled to the drain bit-line junction 110, a source terminal 124 coupled to the source bit-line junction 114, and a substrate or p-well terminal 126 coupled to the substrate or p-well 103. FIG. 3 illustrates a flash memory device 130 comprised of an array of flash memory cells, as known to one of ordinary skill in the art of flash memory technology.

Referring to FIG. 3, the array of flash memory cells 130 includes rows and columns of flash memory cells with each flash memory cell having similar structure to the flash memory cell 100 of FIGS. 1 and 2. In the array of flash memory cells 130, the control gate terminals of all flash memory cells in a row of the array are coupled together to form a respective word-line for that row. In FIG. 3, the control gate terminals of all flash memory cells in the first, second, third, and fourth rows are coupled together to form the first, second, third, and fourth word-lines 132, 134, 136, and 138, respectively.

In addition, the drain terminals of all flash memory cells in a column are coupled together to form a respective bit-line for that column. In FIG. 3, the drain terminals of all flash memory cells in the first, second, third, fourth, fifth, sixth, seventh, eighth, and ninth columns are coupled together to form first, second, third, fourth, fifth, sixth, seventh, eighth, and ninth bit-lines 142, 144, 146, 148, 150, 152, 154, 156, and 158, respectively. An array of flash memory cells for a flash memory device typically has more numerous rows and columns, but four rows and nine columns are illustrated in FIG. 3 for simplicity and clarity of illustration.

Further referring to FIG. 3, the source terminal of all flash memory cells of the array 130 are coupled together to a source voltage $V_{SS}$. In addition, the substrate or p-well terminals for all flash memory cells of the array 130 are coupled together to a substrate voltage $V_{SUB}$ (not shown in FIG. 3 for clarity of illustration). The source voltage $V_{SS}$ and the substrate voltage $V_{SUB}$ may be ground for example.

In FIG. 3, $V_{SS}$ lines, including first, second, and third $V_{SS}$ lines, 162, 164, and 166 are periodically situated after a predetermined number of bit-lines. In FIG. 3 for example, the first, second, and third $V_{SS}$ lines, 162, 164, and 166 are each situated after four bit-lines. The source terminal of all flash memory-cells of the array 130 are coupled to the $V_{SS}$ lines, 162, 164, and 166. A plurality of the $V_{SS}$ lines, 162, 164, and 166 are interspersed between the bit-lines of the array 130 for minimizing resistance at the source terminal of all flash memory cells of the array 130.

Referring to FIG. 3, when an example flash memory cell 170 of the array 130 comprised of N-channel cells is programmed, approximately 10 Volts is applied to the word-line 136 for the flash memory cell 170, approximately 5.5 Volts is applied to the bit-line 144 for the flash memory cell 170, and the source and substrate terminals for the flash memory cell 170 are typically grounded. With such voltages applied, electrons are injected into the floating gate of the flash memory cell 170 to raise the threshold voltage of the flash memory cell 170.

During programming of the example flash memory cell 170, such electron injection may disadvantageously affect the threshold voltage of the neighboring flash memory cells 172, 174, 176, and 178. Such undesirable effect on the threshold voltage of the adjacent flash memory cells 172, 174, 176, and 178 is via FG—FG (floating gate to floating gate) capacitive coupling during such electron injection.

Adjacent flash memory cells 172 and 174 share the same word-line 136 with the flash memory cell 170. FIG. 5 illustrates a cross-sectional view of the flash memory cell 170 and one of the adjacent flash memory cells 172 and 174 sharing the same word-line 136. In FIG. 5, if the tunnel dielectric 102, the floating gate 104, and the control dielectric 106 to the left are for the flash memory cell 170, then a tunnel dielectric 202, a floating gate 204, and a control dielectric 206 to the right are for one of the adjacent flash memory cells 172 or 174.

A control gate 208 is continuous across the flash memory cells 170 and 172 for forming the common word-line 136 for a row of flash memory cells. The inter-level dielectric 194 surrounds the gate structures of such adjacent flash memory cells in FIG. 5. Shallow trench isolation structures 151, 153, and 155 formed in the substrate 103 define the active device areas of the flash memory cells in FIG. 5. The two floating gates 104 and 204 of the adjacent flash memory cells of FIG. 5 are separated by a distance 219.

Similarly, FIG. 4 illustrates a cross-sectional view of the flash memory cell 170 and the adjacent flash memory cells 176 and 178 sharing the same bit-line 144. In FIG. 4, the tunnel dielectric 102, the floating gate 104, the control dielectric 106, and the control gate 108 are for the flash memory cell 170. Similarly, the tunnel dielectric 201, the floating gate 203, the control dielectric 205, and the control gate 207 are for the flash memory cell 176. In addition, the tunnel dielectric 209, the floating gate 210, the control dielectric 211, and the control gate 212 are for the flash memory cell 178.

Furthermore, the flash memory cell 176 has a drain bit line junction 213 and a source line junction 214, the flash memory cell 170 has the source line junction 214 and a drain bit line junction 215, and the flash memory cell 178 has the drain bit line junction 215 and a source line junction 216. The inter-level dielectric 194 surrounds the gate structures of the flash memory cells in FIG. 4. The flash memory cells 176 and 170 share the common source line junction 214, and the flash memory cells 170 and 178 share the common drain bit line junction 215. Such source and drain line junctions 214 and 215 are shared for minimizing the area occupied by the flash memory cells of the array 130.

Typically, an example flash memory cell 170 of the array 130 has one neighboring flash memory cell 176 sharing a common source line junction 214 and has another neighboring flash memory cell 178 sharing a common drain bit line junction 215. The two floating gates 203 and 104 of the adjacent flash memory cells 176 and 170 sharing the common source line junction 214 are separated by a distance 217. Similarly, the two floating gates 210 and 104 of the adjacent flash memory cells 178 and 170 sharing the common drain bit line junction 215 are separated by a distance 218. The distance 218 over the common drain bit line junction 215 is typically much larger than the distance 217 over the common source line junction 214 because a contact is formed on the common drain bit line junction 214.

Referring to FIGS. 3, 4, and 5, with constant advancement of flash memory technology, the structures of flash memory cells of the array 130 are formed to be smaller and denser. Thus, the distances 217, 218, and 219 between the floating gates of adjacent flash memory cells in the array 130 is constantly decreasing with advancement of flash memory technology. With such smaller distances 217, 218, and 219, especially the distances 217 and 219, between the floating gates of adjacent flash memory cells, FG—FG coupling becomes more prevalent.

For example, referring to FIGS. 4 and 5, during programming of the flash memory cell 170, electrons are injected into the floating gate 104. However, with the smaller distances 217 and 219, the electrons injected into floating gate 104 affect the threshold voltage of the adjacent flash memory cells via FG—FG capacitive coupling.

Typically, the common drain bit line junction 215 is relatively large for forming a contact thereon. Thus, the distance 218 is relatively large, and FG—FG coupling between the floating gates 104 and 210 is typically negligible as a result. With the smaller distances 217 or 219, the capacitance between adjacent floating gates 104 and 203 or 204 is larger causing the threshold voltage of the adjacent flash memory cells to undesirably increase via FG—FG capacitive coupling.

Unfortunately, the prior art does not compensate for such undesired FG—FG coupling during programming of a flash memory device. FIG. 6 shows a flow-chart of steps for programming a group of flash memory cells in a page. The whole array 130 for a flash memory device is divided into pages, and the steps of FIG. 6 are performed for programming a group of flash memory cells within a page at a time.

Typically, each flash memory cell of an array is first erased to an initial lower threshold voltage such as 2 Volts for example. Referring to FIG. 6, the address of each flash memory cell of a group of flash memory cells to be programmed is indicated (step 222 of FIG. 6). A program verify step is performed to determine if the threshold voltage of a flash memory cell of the group to be programmed has not attained the program verify level and thus does not pass program verify (step 224 of FIG. 6).

If all flash memory cells of the group to be programmed pass program verify (step 226 of FIG. 6), then programming for the group ends. On the other hand, if a flash memory cell of the group does not pass program verify (step 226 of FIG. 6), a programming pulse is generated for the flash memory cell of the group not passing program verify (step 228 of FIG. 6). During such a programming pulse, programming voltages are applied on the respective word-line and bit-line for the flash memory cell of the group not passing program verify in steps 224 and 226 of FIG. 6. Such programming voltages raise the threshold voltage of such a flash memory cell, and steps 224, 226, and 228 are repeated until all flash memory cells of the group pass program verify at step 226.

The prior art steps of FIG. 6 for programming do not compensate for FG—FG coupling between adjacent flash memory cells. However, when an adjacent flash memory cell sharing a same word-line or bit-line is programmed to the final threshold voltage, such as 5 Volts for example, FG—FG coupling may cause the threshold voltage of an adjacent flash memory cell to change by hundreds of millivolts.

For example, referring to FIG. 3, assume that flash memory cells 170, 172, 174, 176, and 178 are part of one page of the flash memory device 130. In addition, assume that any flash memory cell of the array 130 is desired to be programmed to the final threshold voltage of 5 Volts for example. Furthermore, assume that in an example programming algorithm, the flash memory cells 170, 172, 174, 176, and 178 are programmed sequentially in that order. Thus, the flash memory cell 170 is first programmed to the final threshold voltage of 5.0 Volts, and then the flash memory cell 172 is programmed to the final threshold voltage of 5.0 Volts, and so on sequentially through the flash memory cell 178.

Referring to FIGS. 4 and 5, the distance 219 between the floating gates 104 and 204 for adjacent flash memory cells sharing a same word-line is typically low enough such that FG—FG coupling between such cells is significant during programming. In addition, the distance 217 between the floating gates 203 and 104 for adjacent flash memory cells 176 and 170 sharing a common source line 214 is typically low enough such that FG—FG coupling between such cells is significant during programming. On the other hand, the distance 218 between floating gates 210 and 104 for adjacent flash memory cells 178 and 170 sharing a common drain bit line 215 is relatively large such that FG—FG coupling between such cells is negligible.

Referring back to the example of the five flash memory cells 170, 172, 174, 176, and 178 to be programmed, assume that when a flash memory cell is programmed to the final threshold voltage of 5 Volts, the effect on the threshold voltage of an adjacent flash memory cell sharing a same word-line is 300 milli-volts. In addition, assume that the effect on the threshold voltage of an adjacent flash memory cell sharing a common source line is 400 milli-volts.

First, assume that the flash memory cell 170 is programmed to have the final threshold voltage of 5 Volts, according to the steps of FIG. 6. Then, if any of the adjacent flash memory cells 172, 174, 176, 178 of the same page is subsequently programmed to have the final threshold voltage of 5 Volts, the threshold voltage of the flash memory cell 170 undesirably increases from FG—FG coupling.

Assume the worst case scenario of all of the adjacent flash memory cells 172, 174, 176, 178 being part of the group to be subsequently programmed for the page. In that case, when the adjacent flash memory cells 172 and 174 sharing the same word-line are programmed to the final threshold voltage of 5 Volts, the threshold voltage of the flash memory cell 170 increases by a total of 600 milli-volts to 5.6 Volts. Additionally, when the adjacent flash memory cells 176 and 178 sharing the same bit-line are programmed to the final threshold voltage of 5 Volts, the threshold voltage of the flash memory cell 170 increases by a total of 400 milli-volts to 6.0 Volts. In this manner, the flash memory cell 170 has an undesired increase of 1.0 Volts to the final threshold voltage after programming the group of flash memory cells 170, 172, 174, 176, and 178 according to the prior art steps of FIG. 6.

Note that FG—FG coupling affects the threshold voltage of an adjacent flash memory when a given flash memory cell is programmed subsequently after that adjacent flash memory cell has already been programmed. On the other hand, if the adjacent flash memory cell is programmed after the given flash memory cell has already been programmed, the disturbance to the threshold voltage of the adjacent flash memory cell from FG—FG coupling is taken into account during program verify such that the effect of FG—FG coupling is not apparent for the adjacent flash memory cell. Thus, in the example of the flash memory cells 172, 174, 176, and 178 being programmed subsequent to the flash memory cell 170, the flash memory cells 172, 174, 176, and 178 attain a threshold voltage of substantially 5.0 Volts after the steps of FIG. 6.

Furthermore, in multi-level flash memory devices, different flash memory cells of the array 130 are programmed to different threshold voltages. Such flash memory cells of a multi-level flash memory device are used for storing multi-bit information, as known to one of ordinary skill in the art of flash memory technology. For example, referring to FIG. 3, assume that the flash memory cell 170 is to be programmed to have a threshold voltage of 3 Volts while the flash memory cell 174 is to be programmed to have a threshold voltage of 5 Volts.

In that case, referring to FIGS. 3 and 6, the loop of steps 224, 226, and 228 are repeated until the flash memory cell 170 attains a threshold voltage of 3 Volts and until the flash memory cell 174 attains a threshold voltage of 5 Volts. There are numerous algorithms for programming the flash memory cells 170 and 174 to the different threshold voltages, as known to one of ordinary skill in the art of multi-level flash memory devices. However, typically, both of the flash memory cells 170 and 174 are programmed to have a threshold voltage of 3 Volts, and then the threshold voltage of the flash memory cell 174 is additionally raised to 5 Volts. During programming for the additional 2 Volts change in the threshold voltage of the flash memory cell 174, FG—FG coupling between flash memory cells 170 and 174 may undesirably raise the threshold voltage of the flash memory cell 170 to 3.2 Volts.

Such undesired change in the threshold voltage of a flash memory cells from FG—FG coupling may result in error during reading of data from the flash memory cell. Thus, a mechanism is desired for compensating for such FG—FG coupling during programming of the flash memory device.

SUMMARY OF THE INVENTION

Accordingly, in a general aspect of the present invention, a plurality of passes of a loop of program verify and programming steps are performed for minimizing the effects of FG—FG coupling during programming a page of a flash memory device.

In one embodiment of the present invention, for programming a group of at least one flash memory cell of an array, a first pass of program verify and programming steps is performed until each flash memory cell of the group attains a threshold voltage that is at least X % of a program verify level but less than the program verify level. Then, a second pass of program verify and programming steps are performed until each flash memory cell of the group attains a threshold voltage that is substantially the program verify level.

In a further embodiment of the present invention, (100%–X %) of the program verify level is a maximum potential change to a threshold voltage of a flash memory cell from programming any adjacent flash memory cells to the program verify level.

In another embodiment, the group includes a plurality of flash memory cells to be programmed to multi-level threshold voltages. In that case, the first pass of program verify and programming steps is performed until each flash memory cell of a first sub-group attains a threshold voltage that is at least Y % of a first program verify level but less than the first program verify level, and until each flash memory cell of a second sub-group attains a threshold voltage that is at least Z % of a second program verify level but less than the second program verify level. In addition, the second pass of program verify and programming steps is performed until each flash memory cell of the first sub-group attains substantially the first program verify level, and until each flash memory cell of the second sub-group attains substantially the second program verify level.

In the case of programming to multi-level threshold voltages, (100%–Y %) of the first program verify level and (100%–Z %) of the second program verify level are each a maximum potential change to a threshold voltage of a flash memory cell from programming any adjacent flash memory cell to the higher of the first and second program verify levels.

In this manner, first and second passes of the loop of program verify and programming steps are performed for compensating for FG—FG coupling. After the first pass of the loop of program verify and programming steps, the threshold voltage of a programmed flash memory cell reaches a value less than the program verify level. Subsequently, the second pass of the loop of program verify and programming steps is then performed for "fine-tuning" the threshold voltage to the program verify level. The amount of change to the threshold voltage for an adjacent flash memory cell from FG—FG coupling is proportional to the change in threshold voltage during programming of a flash memory cell. Because the change of threshold voltage during the second pass is relatively small, the effect of FG—FG coupling during the second pass is negligible. With performance of such multiple passes of program verify and programming steps, the effect of FG—FG coupling may be substantially eliminated during programming a page of a flash memory device.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, and 10 refer to elements having similar structure and function.

DETAILED DESCRIPTION

Figure 7:
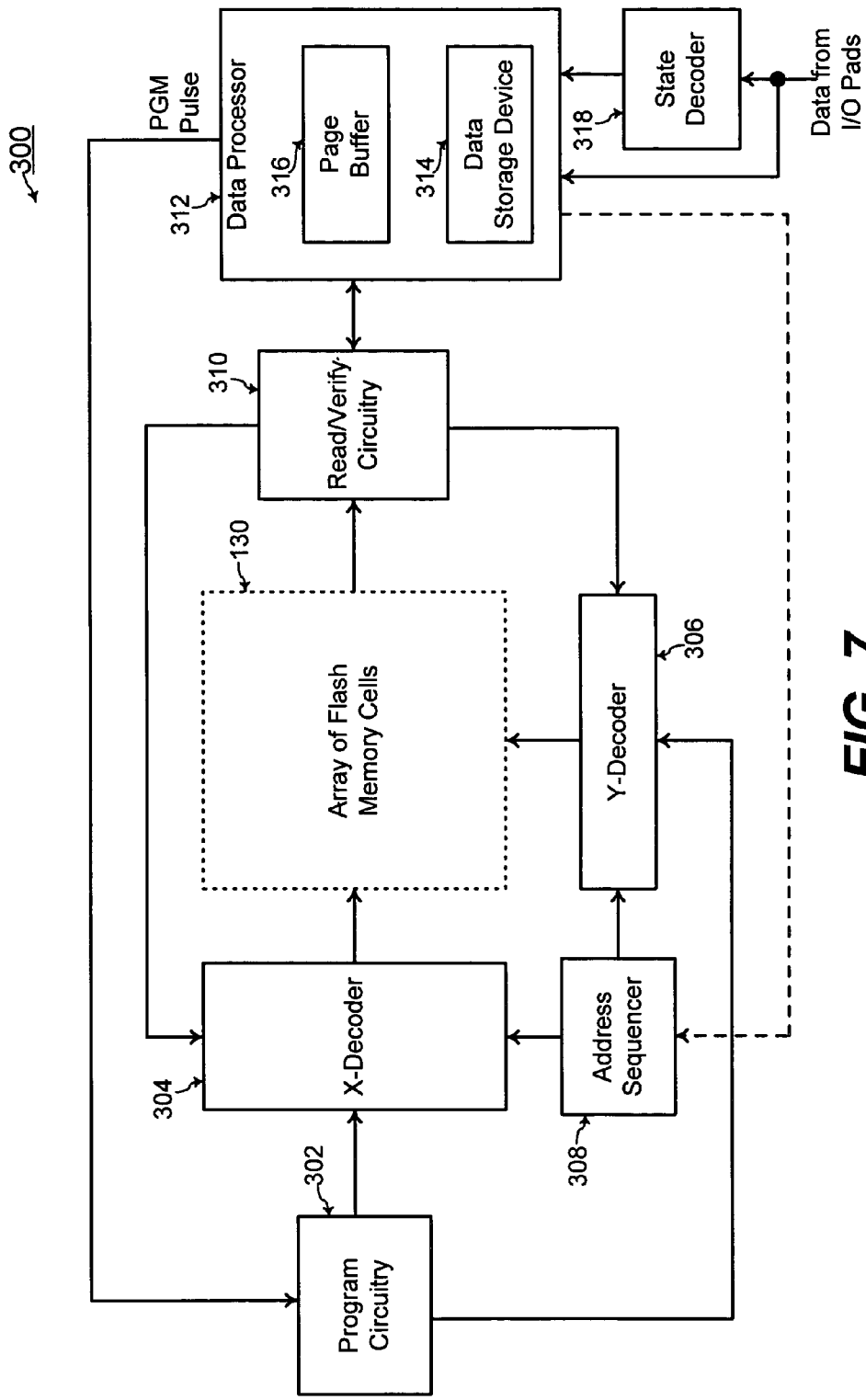
FIG. 7 shows a block diagram of components of a system for compensating for FG—FG coupling during programming a group of flash memory cells, according to an embodiment of the present invention.

FIG. 7 shows a block diagram of a system 300 for programming the array of flash memory cells 130 with compensation for FG—FG coupling. The system 300 includes a program circuitry 302 for generating programming voltages to be applied on a flash memory cell to be programmed. In addition, an X-decoder 304 and a Y-decoder 306 are coupled between the program circuitry 302, the array of flash memory cells 130, and an address sequencer 308.

The address sequencer 308 provides the address bits for a flash memory cell in the array 130 to be programmed. The X-decoder 304 and the Y-decoder 306 decode the address bits from the address sequencer 308 to couple the programming voltages from the program circuitry 302 on the word-line and the bit-line, respectively, for the flash memory cell to be programmed.

A read/verify circuitry 310 generates reading voltages used for reading the programmed or erased state of a flash memory cell. The X-decoder 304 and the Y-decoder 306 decode the address bits from the address sequencer 308 to couple the reading voltages from the read/verify circuitry 310 on the word-line and the bit-line, respectively, for reading the flash memory cell. In addition, the current output of such a flash memory cell is coupled to the read/verify circuitry 310 that includes a reference for determining whether the flash memory cell is programmed to a program verify level.

The program circuitry 302, the X-decoder 304, the Y-decoder 306, the address sequencer 308, and the read/verify circuitry 310 individually are components commonly used in flash memory devices. Thus, implementation for such components individually is known to one of ordinary skill in the art of flash memory technology.

A data processor 312 controls operation of the components 302, 308, and 310 for performing the steps for programming flash memory cells of the array 130. The data processor includes a data storage device 314 and a page buffer 316 that is also a data storage device. A state decoder 318 decodes data from I/O pads for determining whether a user desires programming flash memory cells of the array 130. Implementation for each of the components 312, 314, 316, and 318 individually is known to one of ordinary skill in the art of flash memory technology.

Figure 8:
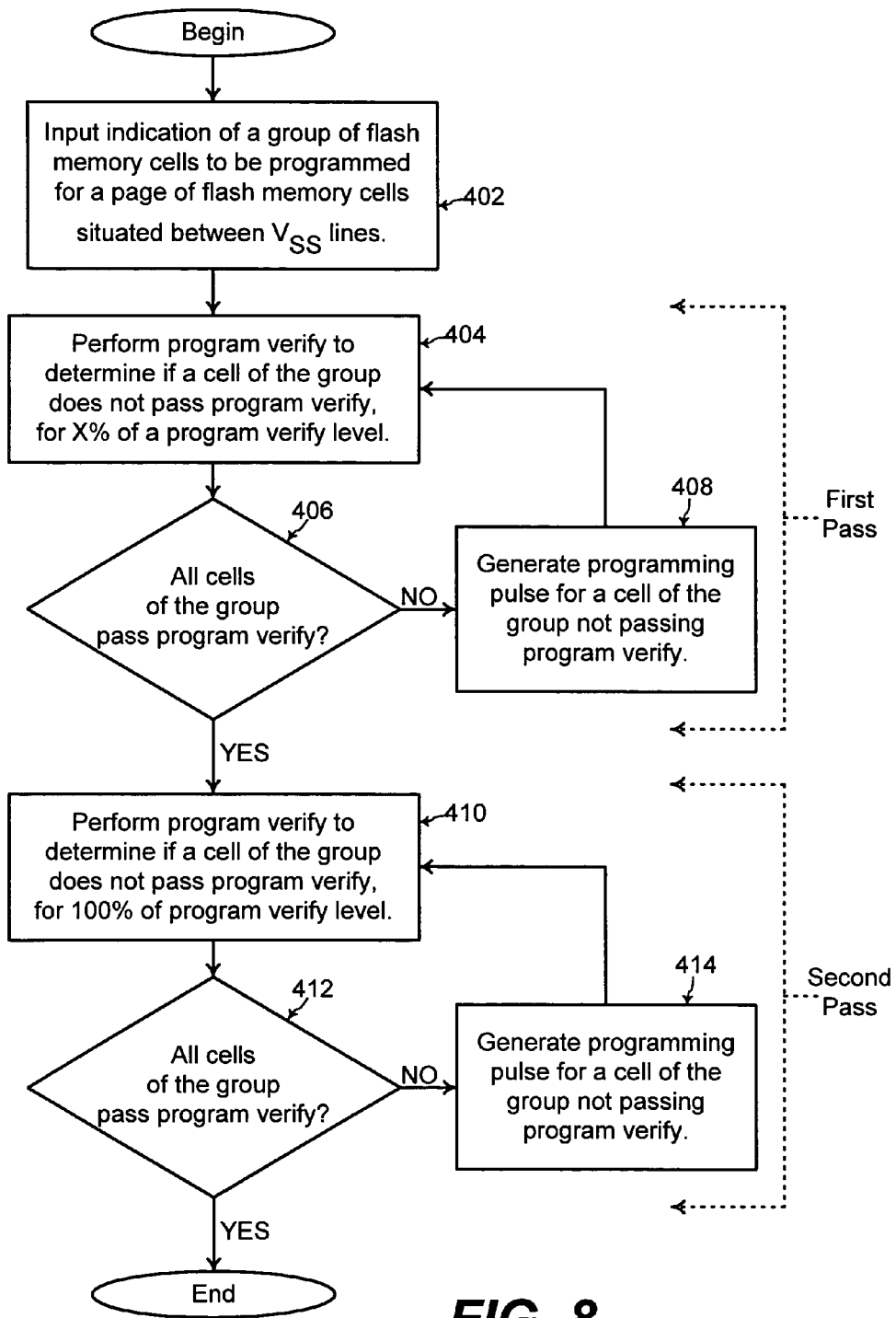
FIG. 8 shows a flow-chart of steps for compensating for FG—FG coupling during programming a group of flash memory cells, according to an embodiment of the present invention.

FIG. 8 shows a flow-chart of steps performed by the system 300 of FIG. 7 for programming a group of flash memory cells of the array 130, according to an embodiment of the present invention. Sequences of instructions may be stored within the data storage device 314 that when executed by the data processor 312 causes the system 300 to perform the steps of FIG. 8.

Figure 1:
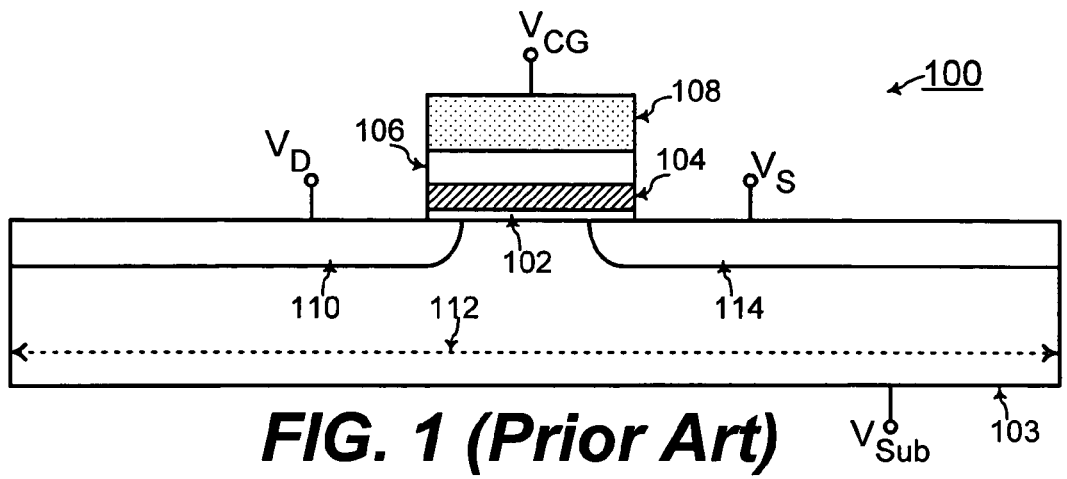
FIG. 1 shows a cross-sectional view of a flash memory cell, according to the prior art.
Figure 2:
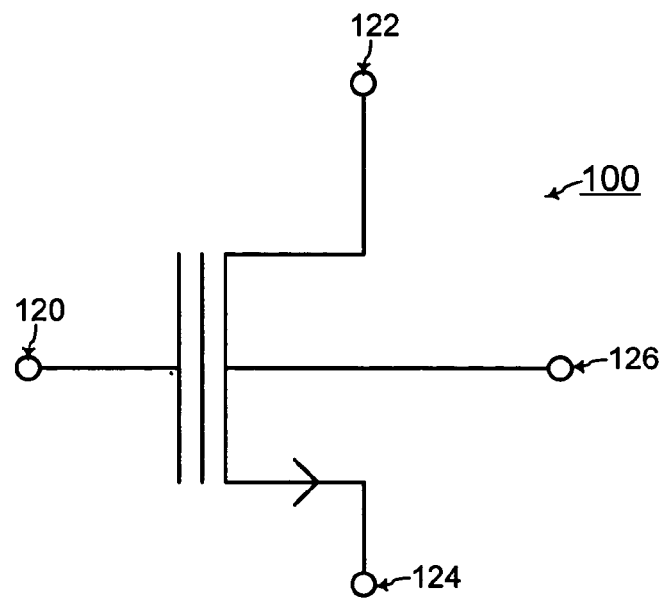
FIG. 2 shows a circuit diagram representation of the flash memory cell of FIG. 1, according to the prior art.
Figure 3:
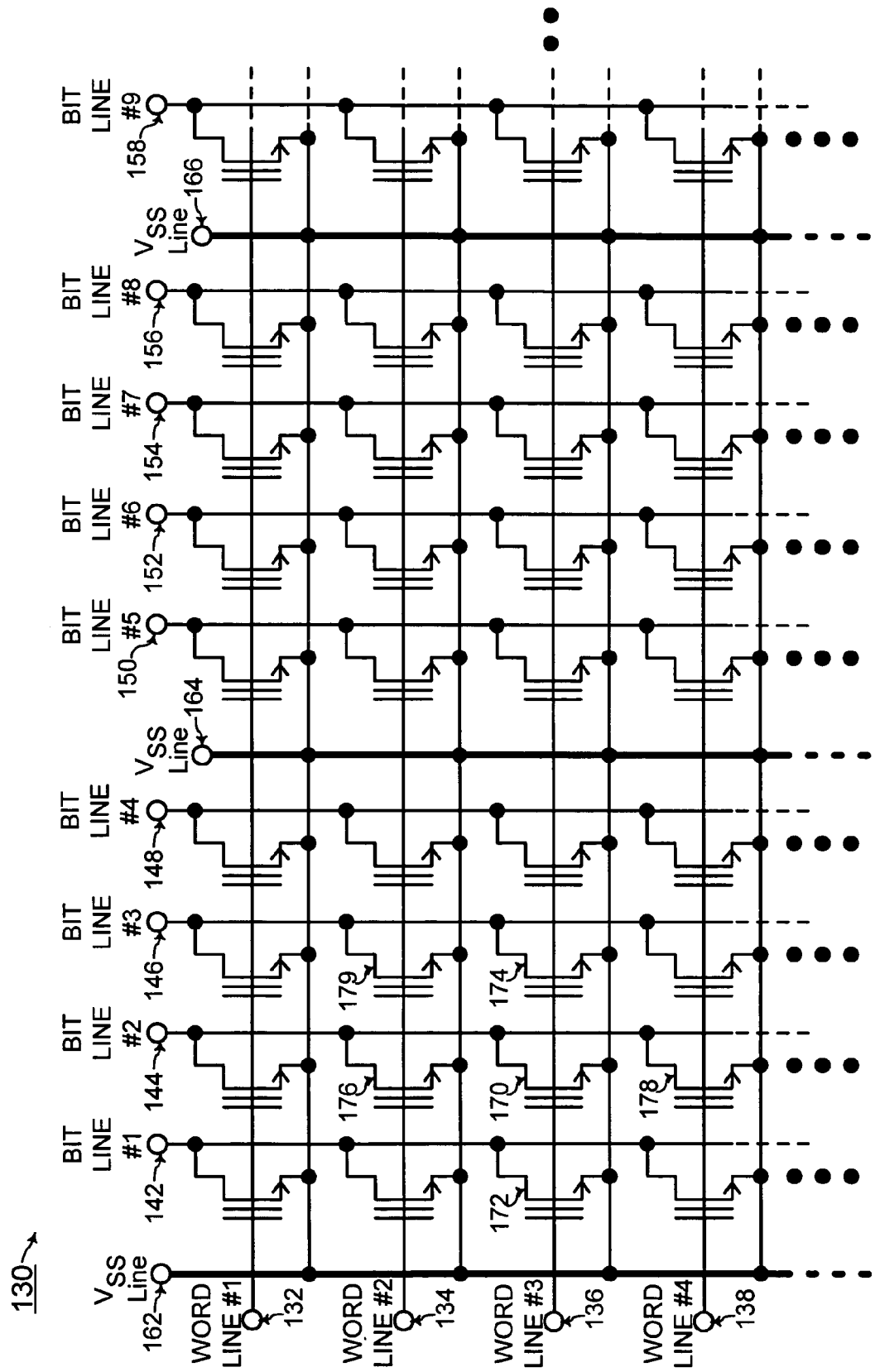
FIG. 3 shows an array of flash memory cells comprising a flash memory device, according to the prior art.

Referring to FIGS. 3, 7, and 8, the state decoder 318 inputs and decodes data from I/O pads indicating that a group of at least one flash memory cell of a page is to be programmed (step 402 of FIG. 8). In addition, each respective address of the flash memory cells of the group to be programmed is input from the I/O pads and is stored by the page buffer 316 (step 402 of FIG. 8). The steps of FIG. 8 are performed for a group of at least one flash memory cell within one page at a time. The flash memory cells of the array 130 are divided into a plurality of pages with each page comprising an exclusive set of flash memory cells of the array 130.

Referring to FIG. 3, assume that flash memory cells 170, 172, 174, 176, and 179 comprise the group of flash memory cells to be programmed to have a final threshold voltage at a program verify level, for a page. In addition, typically, all of the flash memory cells of the array 130 or of a sector of the array 130 having the flash memory cells 170, 172, 174, 176, and 179 have been erased to have an initial low threshold voltage such as 2 Volts for example. In any case, the data processor 312 controls the read/verify circuitry 310 to perform program verify for the flash memory cells 170, 172, 174, 176, and 179 of the group (step 404 of FIG. 8).

In an embodiment of the present invention, during such program verify of a flash memory cell, the read/verify circuitry 310 determines whether the threshold voltage of the flash memory cell has reached X % of the program verify level, with X % being less than 100%. If the threshold voltage of the flash memory cell is equal to or greater than X % of the program verify level, the flash memory cell passes program verify, and if not, the flash memory cell does not pass program verify. Such a program verify step is performed for each of the flash memory cells 170, 172, 174, 176, and 179 of the group (step 404 of FIG. 8).

If all of the cells 170, 172, 174, 176, and 179 of the group do not pass program verify (step 406 of FIG. 8), the data processor 312 generates a PGM (program) pulse to the program circuitry 302 (step 408 of FIG. 8). During the PGM pulse, the program circuitry 302 generates the programming voltages to be applied on one of the cells 170, 172, 174, 176, and 179 of the group not passing program verify during step 404. The loop of steps 404, 406, and 408 are repeated in a first pass until each of the cells 170, 172, 174, 176, and 179 of the group passes program verify at step 406 to end the first pass.

At that point, each of the cells 170, 172, 174, 176, and 179 of the group has attained a threshold voltage of at least X % of the program verify level. In one embodiment of the present invention, (100%–X %) of the program verify level is a maximum potential change to a threshold voltage of a flash memory cell from FG—FG coupling with programming any adjacent flash memory cells to the program verify level. Referring to FIG. 3, the maximum potential change of the threshold voltage for the example flash memory cell 170 results from subsequently programming the four adjacent flash memory cells 172, 174, 176, and 178, in the worse case scenario.

For example, assume that when a flash memory cell of the array 130 is programmed to the program verify level of 5 Volts, the effect on the threshold voltage of an adjacent flash memory cell sharing a same word-line is 300 milli-volts. In addition, assume that the effect on the threshold voltage of an adjacent flash memory cell sharing a common source line along a bit-line is 400 milli-volts. Furthermore, assume the effect on the threshold voltage of an adjacent flash memory cell sharing a common drain bit line junction is negligible. In that case, if the four adjacent flash memory cells 172, 174, 176, and 178 are programmed, then the maximum potential change to the threshold voltage of the flash memory cell 170 is a total of 1,000 milli-volts, in the worse case scenario.

In such an example, during the first pass of the loop of program verify and programming steps 404, 406, and 408 in FIG. 8, each of the cells 170, 172, 174, 176, and 179 of the group are programmed sequentially in that order to an intermediate threshold voltage of 4.0 Volts with the final program verify level being 5.0 Volts. Thus, X % of the final program verify level is 4.0 Volts with X % being 80% in the example. Further in that example, after the first pass of program verify and programming steps 404, 406, and 408, each of the cells 170, 172, 174, 176, and 179 of the group have attained a threshold voltage of at least 4.0 Volts but less than the final program verify level of 5.0 Volts.

For example, assume that when a flash memory cell of the array 130 is programmed to 4.0 Volts, the effect on the threshold voltage of an adjacent flash memory cell sharing a same word-line is 250 milli-volts. In addition, assume that the effect on the threshold voltage of an adjacent flash memory cell sharing a common source line along a bit-line is 300 milli-volts. Furthermore, assume the effect on the threshold voltage of an adjacent flash memory cell sharing a common drain bit line junction is negligible. Additionally, assume that the cells 170, 172, 174, 176, and 179 of the group are programmed to 4.0 Volts sequentially in that order. Thus, flash memory cell 170 is first programmed to 4.0 Volts, and then flash memory cell 172 is programmed to 4.0 Volts, and so on until flash memory cell 179 is programmed to 4.0 Volts.

In that case, the flash memory cell 170 attains a threshold voltage of 4.0 Volts plus 500 milli-volts from FG—FG coupling with subsequent programming of the adjacent flash memory cells 172 and 174 sharing a same word-line, plus 300 milli-volts from FG—FG coupling with subsequent programming of the adjacent flash memory cell 176 sharing a common source line, for a total threshold voltage of 4.8 Volts after the first pass. In addition, flash memory cell 174 attains a threshold voltage of 4.0 Volts plus 300 milli-volts from FG—FG coupling with subsequent programming of the adjacent flash memory cell 179 sharing a common source line, for a total threshold voltage of 4.3 Volts after the first pass. Similarly, flash memory cell 176 attains a threshold voltage of 4.0 Volts plus 250 milli-volts from FG—FG coupling with subsequent programming of the adjacent flash memory cell 179 sharing a same word-line, for a total threshold voltage of 4.25 Volts after the first pass.

Note that FG—FG coupling affects the threshold voltage of an adjacent flash memory when a given flash memory cell is programmed subsequently after that adjacent flash memory cell has already been programmed. On the other hand, if the adjacent flash memory cell is programmed after the given flash memory cell has already been programmed, the disturbance to the threshold voltage of the adjacent flash memory cell from FG—FG coupling is taken into account during program verify such that the effect of FG—FG coupling is not apparent for the adjacent flash memory cell. Thus, in the example of the flash memory cells 170, 172, 174, 176, and 179 being programmed sequentially in that order, the flash memory cells 172 and 179 attain a threshold voltage of substantially 4.0 Volts after the first pass.

After the first pass of program verify and programming steps 404, 406, and 408, a second pass of program verify and programming steps is performed for attaining the final program verify level. Thus, the data processor 312 controls the read/verify circuitry 310 to perform program verify for each of the flash memory cells 170, 172, 174, 176, and 179 of the group to determine whether the threshold voltage of the flash memory cell has reached the final program verify level, (step 410 of FIG. 8). If the threshold voltage of the flash memory cell is equal to or greater than the program verify level, the flash memory cell passes program verify, and if not, the flash memory cell does not pass program verify. Such a program verify step is performed for each of the flash memory cells 170, 172, 174, 176, and 179 of the group (step 410 of FIG. 8).

If any of the cells 170, 172, 174, 176, and 179 of the group does not pass program verify (step 412 of FIG. 8), the data processor 312 generates a PGM (program) pulse to the program circuitry 302 (step 414 of FIG. 8). During the PGM pulse, the program circuitry 302 generates the programming voltages to be applied on one of the cells 170, 172, 174, 176, and 179 of the group not passing program verify during step 410. The loop of steps 410, 412, and 414 is repeated during the second pass until each of the cells 170, 172, 174, 176, and 179 of the group passes program verify at step 412 to end the second pass.

At that point, each of the cells 170, 172, 174, 176, and 179 of the group has attained approximately the program verify level of 5.0 Volts. Because the change in threshold voltage to each of the cells 170, 172, 174, 176, and 179 during the second pass is relatively small, the effect on the threshold voltage from FG—FG coupling is negligible. For the example of performing the first pass of steps 404, 406, and 408 with X % of the program verify level being 4.0 Volts, the flash memory cells 170, 172, 174, 176, and 179 attained threshold voltages of 4.8 Volts, 4.0 Volts, 4.3 Volts, 4.25 Volts, and 4.0 Volts, respectively, after the first pass. Thus, after performing the second pass of steps 410, 412, and 414 for the final program verify level of 5.0 Volts, the threshold voltages of the flash memory cells 170, 172, 174, 176, and 179 change by 0.2 Volts, 1.0 Volts, 0.7 Volts, 0.75 Volts, and 1.0 Volts, respectively.

The effect on a threshold voltage of a flash memory cell from FG—FG coupling depends on the change in threshold voltage of a programmed adjacent flash memory cell. With such small changes of the threshold voltage during the second pass, the FG—FG coupling is negligible such that each of the flash memory cells 170, 172, 174, 176, and 179 attains a threshold voltage of about 5.0 Volts after the second pass of steps 410, 412, and 414.

In this manner, a first pass of program verify and programming steps 404, 406, and 408 are performed for a relatively large percentage, X %, of the final program verify level. Thus, any significant change to the threshold voltage from programming of an adjacent flash memory cell occurs during the first pass. Yet, X % is selected such that (100%–X %) of the final program verify level is a maximum potential change to a threshold voltage of a flash memory cell from programming any adjacent flash memory cells to the final program verify level. Thus, none of the flash memory cells of the group to be programmed initially passes program verify after the first pass and at the beginning of the second pass.

After such a first pass, the second pass of program verify and programming steps 410, 412, and 414 are performed for "fine-tuning" the threshold voltage to the final program verify level. In addition, the effect of FG—FG coupling from incrementally small changes to the threshold voltage with such fine-tuning is negligible such that each of the flash memory cells of the group attains substantially the final program verify level.

The steps 402, 404, 406, 408, 410, 412, 414 of FIG. 8 are performed for a group of at least one flash memory cell within a page and performed once for that page. The flash memory cells of the array 130 are divided into a plurality of pages with each page comprising an exclusive set of flash memory cells of the array 130. To further minimize FG—FG coupling, the array 130 is organized such that each such page has minimal FG—FG coupling with another page. For example, a page of flash memory cells may be situated between the grounded $V_{SS}$ lines. Thus in that example, referring to FIG. 3, a first page is comprised of the flash memory cells between the first and second $V_{SS}$ lines 162 and 164, and a second page is comprised of the flash memory cells between the second and third $V_{SS}$ lines 164 and 166.

In such an example, for programming selected flash memory cells of the array 130, steps 402, 404, 406, 408, 410, 412, 414 of FIG. 8 are performed for a first group of at least one flash memory cell situated within the first page between the first and second $V_{SS}$ lines 162 and 164. Then, steps 402, 404, 406, 408, 410, 412, 414 of FIG. 8 are subsequently performed for a second group of at least one flash memory cell situated within the second page between the second and third $V_{SS}$ lines 164 and 166, and so on for one page at a time.

The distance between flash memory cells surrounding a $V_{ss}$ line is greater than any other two adjacent flash memory cells in the array 130, and FG—FG coupling between such flash memory cells may be minimal or even negligible. Thus, having a page of flash memory cells bordered by $V_{SS}$ lines and performing the steps of FIG. 8 once for any page further minimizes FG—FG coupling. Note that such minimized FG—FG coupling also results when a page includes any $V_{SS}$ line as long as the page is bordered by $V_{SS}$ lines. For example, a page in FIG. 3 may include all flash memory cells between the first and third $V_{SS}$ lines 162 and 166, including the columns 142, 144, 146, 148, 150, 152, 154, and 156.

Figure 4:
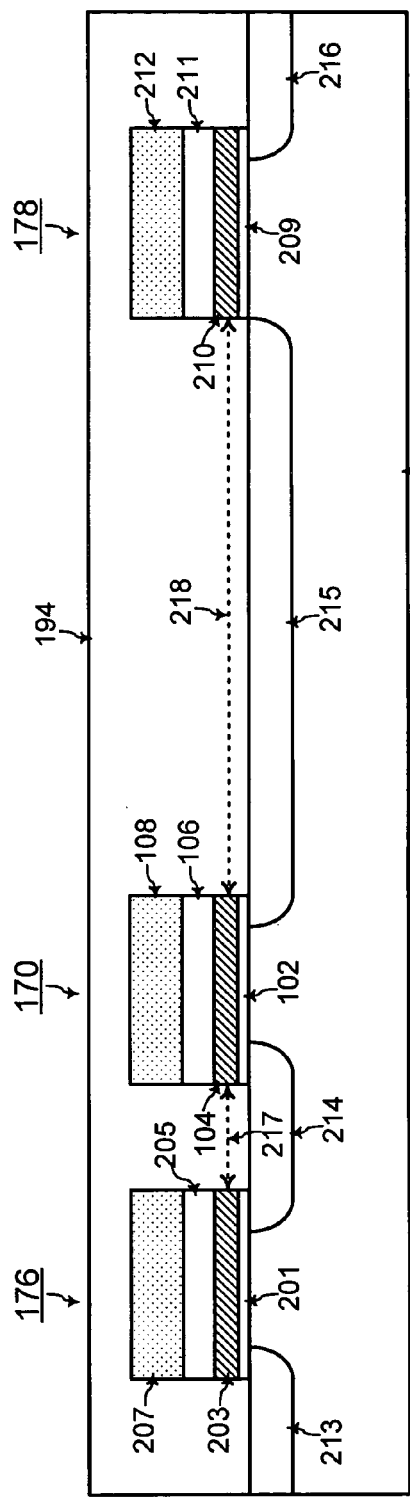
FIG. 4 shows a cross-sectional view of adjacent flash memory cells sharing a bit-line, according to the prior art.
Figure 5:
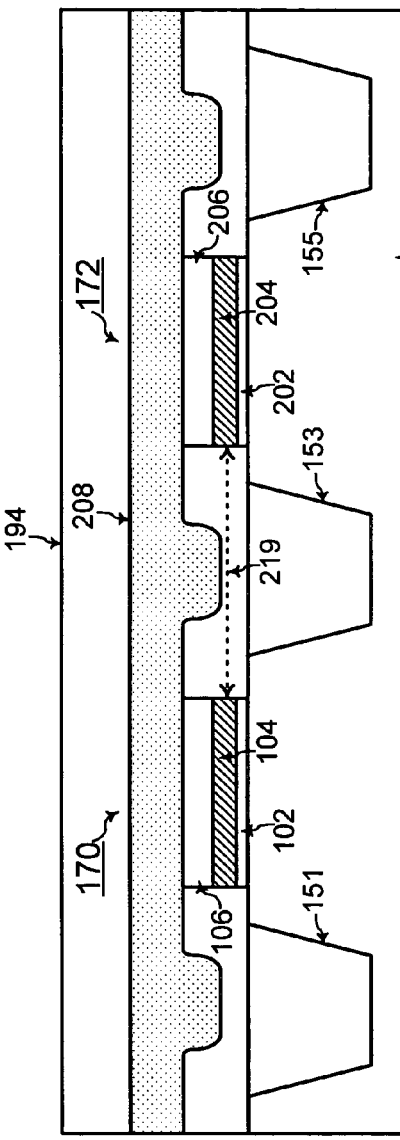
FIG. 5 shows a cross-sectional view of adjacent flash memory cells sharing a word-line, according to the prior art.
Figure 6:
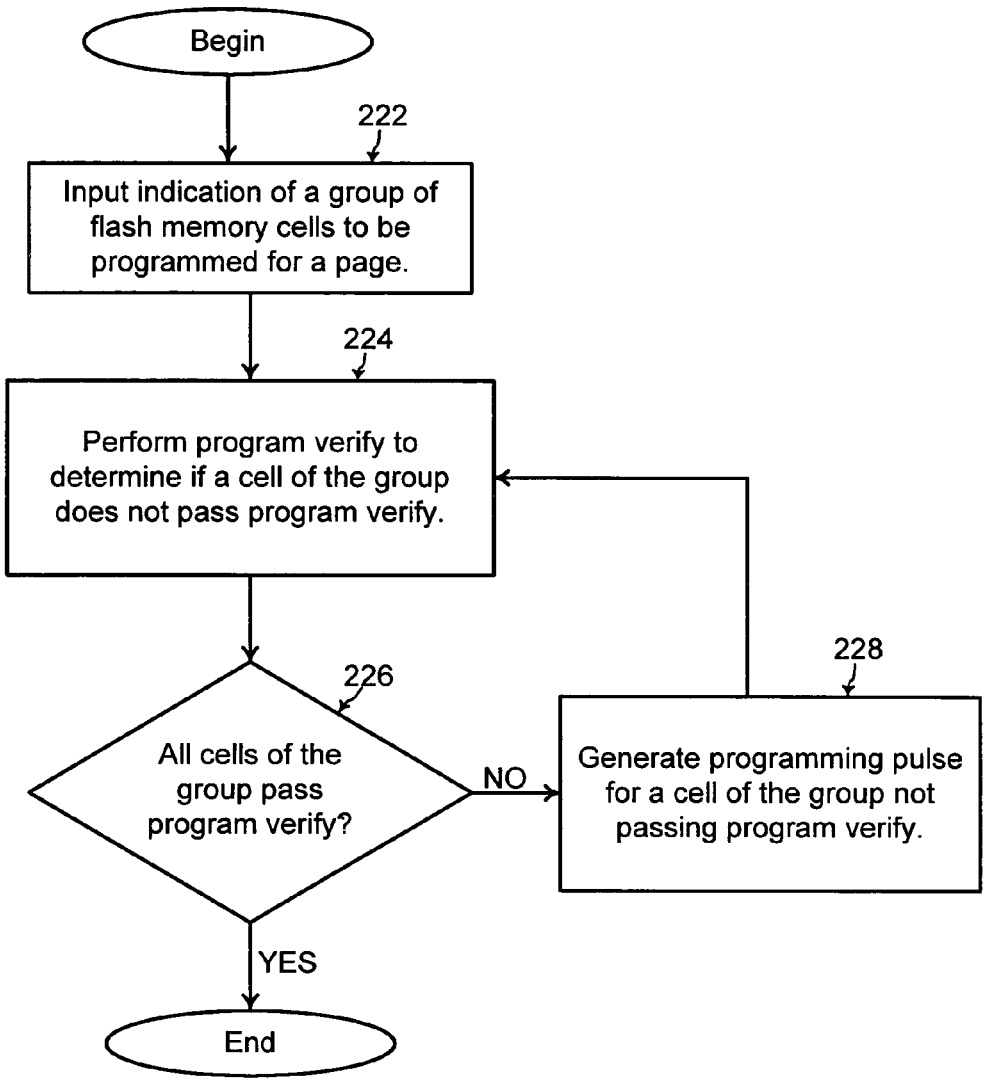
FIG. 6 shows a flow-chart of steps for programming a group of flash memory cells without compensating for FG—FG coupling, according to the prior art.

Similarly, having a page bordered on top and bottom by drain contacts formed on drain bit line junctions is another way for minimizing FG—FG coupling between the pages. As illustrated in FIG. 4, the size of a drain bit line junction 215 is relatively large such that the distance between the floating gates 104 and 210 is relatively large with negligible FG—FG coupling between such floating gates 104 and 210. Thus, an effective way of minimizing FG—FG coupling between pages could be obtained when a first page is comprised of the flash memory cells along two word-lines, sharing a common source line and bordered by two drain bit line junctions, and situated between two $V_{SS}$ lines. For example, each column of such a page of flash memory cells may be coupled to a respective one of a plurality of I/O's of the memory device.

In another embodiment of the present invention, FG—FG coupling is minimized when flash memory cells of the array 130 are programmed to multiple levels of threshold voltages. Such flash memory cells are part of a multi-level flash memory device for storing multi-bit information, as known to one of ordinary skill in the art of flash memory technology.

Figure 9:
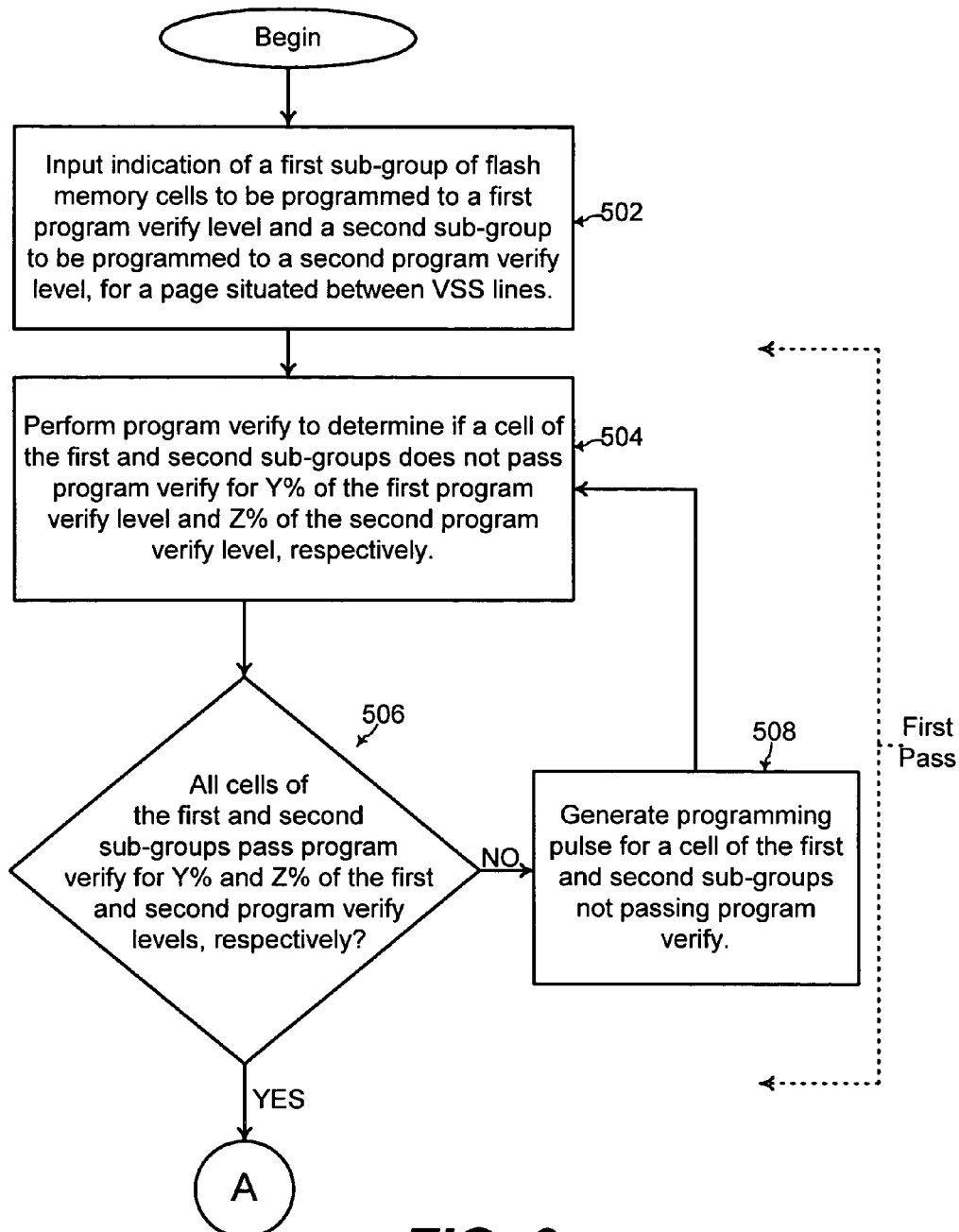
FIGS. 9 and 10 show a flow-chart of steps for compensating for FG—FG coupling during programming a group of flash memory cells to multi-level threshold voltages, according to an embodiment of the present invention.
Figure 10:
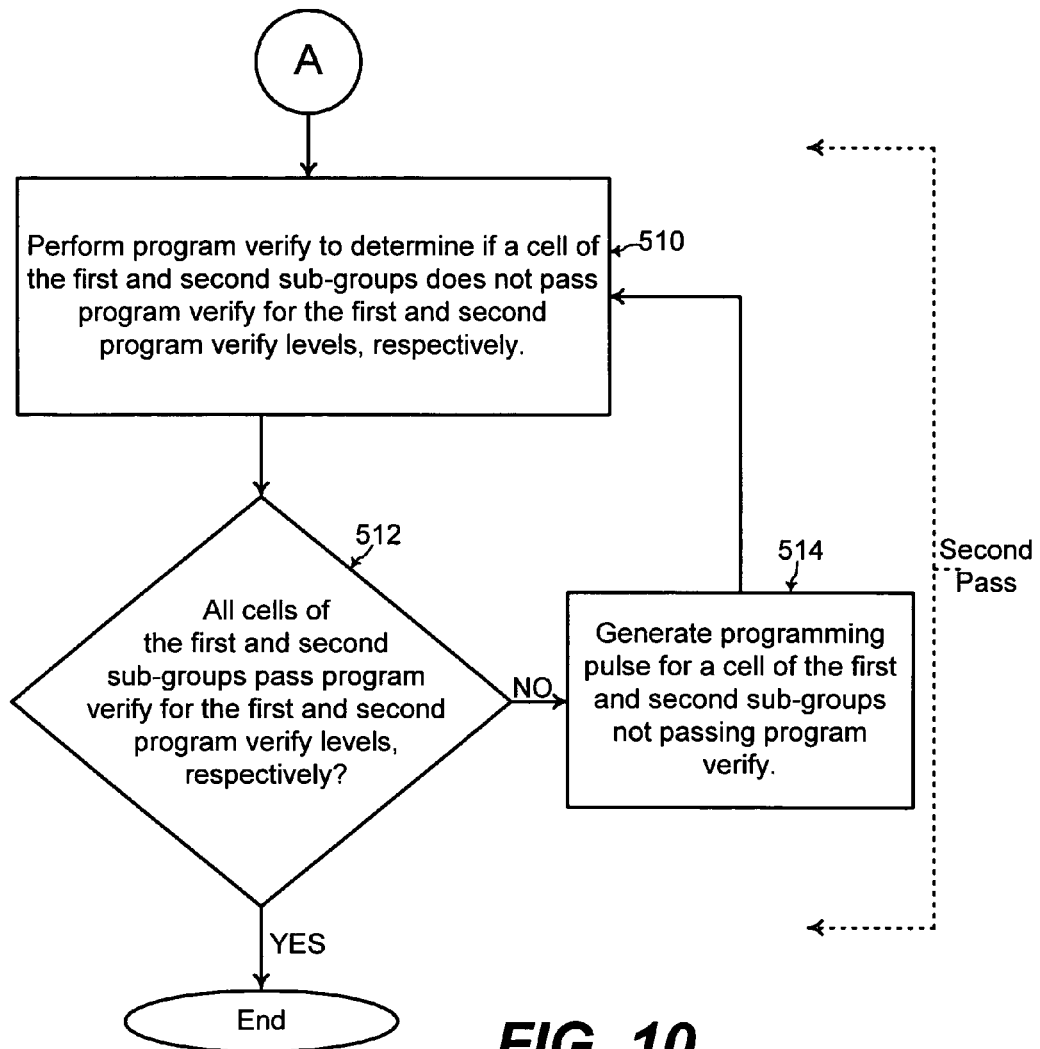

FIGS. 9 and 10 show a flow-chart of steps for such programming to multiple levels of threshold voltages with minimized FG—FG coupling, according to another embodiment of the present invention. Sequences of instructions may be stored within the data storage device 314 that when executed by the data processor 312 causes the system 300 to perform the steps of FIGS. 9 and 10.

Referring to FIGS. 3, 7, and 9, the state decoder 318 inputs and decodes data from I/O pads indicating that a group of at least one flash memory cell of a page is to be programmed to multiple threshold voltages (step 502 of FIG. 9). In addition, each respective address of the flash memory cells of the group to be programmed is input from the I/O pads and is stored by the page buffer 316 (step 502 of FIG. 9). Furthermore, the respective program verify level for each cell of the group to be programmed is also input from the I/O pads and is stored by the page buffer 316 (step 502 of FIG. 9).

Referring to FIG. 3, assume that the group includes a first sub-group with the flash memory cells 170 and 172 to be programmed to a first program verify level of 3.0 Volts and includes a second sub-group with the flash memory cells 174 and 176 to be programmed to a second program verify level of 4.0 Volts. Typically, all of the flash memory cells of the array 130 or of a sector of the array 130 having the flash memory cells 170, 172, 174, and 176 have been erased to have an initial low threshold voltage such as 2.0 Volts for example. In any case, the data processor 312 controls the read/verify circuitry 310 to perform program verify for each of the flash memory cells 170, 172, 174, and 176 of the group (step 504 of FIG. 9).

In an embodiment of the present invention, during such program verify (step 504 of FIG. 9), the read/verify circuitry 310 determines whether the threshold voltage of a flash memory cell has reached a percentage of the final program verify level. For example, if the threshold voltage of the flash memory cell 170 or 172 is equal to or greater than Y % of the first program verify level, then that flash memory cell passes program verify. Any of the flash memory cells 170 and 172 not having a threshold voltage equal to or greater than Y % of the first program verify level does not pass program verify.

Similarly, if the threshold voltage of the flash memory cell 174 or 176 is equal to or greater than Z % of the second program verify level, then that flash memory cell passes program verify. Any of the flash memory cells 174 and 176 not having a threshold voltage equal to or greater than Z % of the second program verify level does not pass program verify.

If any of the cells 170, 172, 174, and 176 of the group does not pass program verify (step 506 of FIG. 9), the data processor 312 generates a PGM (program) pulse to the program circuitry 302 (step 508 of FIG. 9). During the PGM pulse, the program circuitry 302 generates the programming voltages to be applied on one of the cells 170, 172, 174, and 176 of the group not passing program verify during step 504. The loop of steps 504, 506, and 508 are repeated in a first pass until each of the cells 170, 172, 174, and 176 of the group passes program verify at step 506 to end the first pass.

Also assume during the first pass, that each of the cells 170 and 172 are program verified to Y % of the first program verify level sequentially in that order. Another words, flash memory cell 170 is program verified to Y % of the first program verify level, and then thereafter, flash memory cell 172 is program verified to Y % of the first program verify level. Subsequently, each of the cells 174 and 176 are program verified to Z % of the second program verify level sequentially in that order. Thus, flash memory cell 174 is program verified to Z % of the second program verify level, and then thereafter, flash memory cell 176 is program verified to Z % of the second program verify level.

At that point, the flash memory cells 170 and 172 of the first sub-group have attained a threshold voltage of at least Y % of the first program verify level, and the flash memory cells 174 and 176 of the second sub-group have attained a threshold voltage of at least Z % of the second program verify level. In one embodiment of the present invention, (100%–Y %) of the first program verify level and (100%–Z %) of the second program verify level are each a maximum potential change to a threshold voltage of a flash memory cell from FG—FG coupling with subsequent programming of any adjacent flash memory cells to the higher of the first and second program verify levels. Referring to FIG. 3, the maximum potential change to the example flash memory cell 170 results from programming the four adjacent flash memory cells 172, 174, 176, and 178 to the higher of the first and second program verify levels (i.e., to 4.0 Volts), in the worse case scenario.

For an example, assume that when a flash memory cell of the array 130 is programmed to the final program verify level of 4.0 Volts, the effect on the threshold voltage of an adjacent flash memory cell sharing a same word-line is 250 milli-volts. In addition, assume that the effect on the threshold voltage of an adjacent flash memory cell sharing a common source line is 300 milli-volts. Furthermore, assume the effect on the threshold voltage of an adjacent flash memory cell sharing a common drain bit line junction is negligible. In that case, if the four adjacent flash memory cells 172, 174, 176, and 178 are programmed to the program verify level of 4.0 Volts, the maximum potential change to the threshold voltage of the example flash memory cell 170 is a total of 800 milli-volts, in the worse case scenario.

In such an example, during the first pass of the loop of program verify and programming steps 504, 506, and 508 in FIG. 9, the flash memory cells 170 and 172 are program verified for a threshold voltage of 2.2 Volts with the first program verify level being 3.0 Volts. Thus, Y % of the first program verify level is 2.2 Volts with Y % being 73.33% in the example. Subsequently, the flash memory cells 174 and 176 are program verified for a threshold voltage of 3.2 Volts with the second program verify level being 4.0 Volts. Thus, Z % of the second program verify level is 3.2 Volts with Z % being 80% in the example.

Further in that example, after the first pass of program verify and programming steps 504, 506, and 508, each of the flash memory cells 170 and 172 has attained a threshold voltage of at least 2.2 Volts but less than the first program verify level of 3.0 Volts. Similarly, each of the flash memory cells 174 and 176 has attained a threshold voltage of at least 3.2 Volts but less than the second program verify level of 4.0 Volts.

For example, assume that when a flash memory cell of the array 130 is programmed to 2.2 Volts, the effect on the threshold voltage of an adjacent flash memory cell sharing a same word-line is 100 milli-volts, and the effect on the threshold voltage of an adjacent flash memory cell sharing a common source line is 150 milli-volts. Similarly, assume that when a flash memory cell of the array 130 is programmed to 3.2 Volts, the effect on the threshold voltage of an adjacent flash memory cell sharing a same word-line is 150 milli-volts, and the effect on the threshold voltage of an adjacent flash memory cell sharing a common source line is 200 milli-volts. Furthermore, assume the effect on the threshold voltage of an adjacent flash memory cell sharing a common drain bit line junction is negligible.

In that case, the flash memory cell 170 attains a threshold voltage of 2.2 Volts plus 100 milli-volts from FG—FG coupling with subsequent programming of the adjacent flash memory cell 172 to 2.2 Volts, plus 150 milli-volts from FG—FG coupling with subsequent programming of the adjacent flash memory cell 174 to 3.2 Volts, and plus 200 milli-volts from FG—FG coupling with subsequent programming of the adjacent flash memory cell 176 to 3.2 Volts, for a total threshold voltage of 2.65 Volts after the first pass.

Note that FG—FG coupling affects the threshold voltage of an adjacent flash memory when a given flash memory cell is programmed subsequently after that adjacent flash memory cell has already been programmed. On the other hand, if the adjacent flash memory cell is programmed after the given flash memory cell has already been programmed, the disturbance to the threshold voltage of the adjacent flash memory cell from FG—FG coupling is taken into account during program verify such that the effect of FG—FG coupling is not apparent for the adjacent flash memory cell. Thus, in the example of the flash memory cells 170, 172, 174, and 176 being programmed sequentially in that order, the flash memory cells 172, 174, and 176 attain a threshold voltage of substantially 2.2 Volts, 3.2 Volts, and 3.2 Volts, respectively, after the first pass.

After the first pass of program verify and programming steps 504, 506, and 508, a second pass of program verify and programming steps is performed in FIG. 10 for attaining the first or second program verify levels for the cells 170, 172, 174, and 176. Thus, the data processor 312 controls the read/verify circuitry 310 to perform program verify for each of the flash memory cells 170, 172, 174, and 176 for determining whether the threshold voltage of the flash memory cell has reached the first or second program verify levels, (step 510 of FIG. 10).

If the threshold voltage of each of the flash memory cells 170 and 172 is equal to or greater than the first program verify level, the flash memory cells 170 and 172 pass program verify. Any of the flash memory cells 170 and 172 having a threshold voltage not equal to or greater than the first program verify level does not pass program verify. If the threshold voltage of each of the flash memory cells 174 and 176 is equal to or greater than the second program verify level, the flash memory cells 174 and 176 pass program verify. Any of the flash memory cells 174 and 176 having a threshold voltage not equal to or greater than the second program verify level does not pass program verify. Such a program verify step is performed for each of the flash memory cells 170, 172, 174 and 176 of the group (step 510 of FIG. 10).

If any of the cells 170, 172, 174, and 176 of the group do not pass program verify (step 512 of FIG. 10), the data processor 312 generates a PGM (program) pulse to the program circuitry 302 (step 514 of FIG. 10). During the PGM pulse, the program circuitry 302 generates the programming voltages to be applied on one of the cells 170, 172, 174, and 176 of the group not passing program verify during step 510. The loop of steps 510, 512, and 514 is repeated in a second pass until each of the cells 170, 172, 174, and 176 of the group passes program verify at step 512 to end the second pass.

At that point, each of the flash memory cells 170 and 172 has attained approximately the first program verify level for the respective threshold voltage, and each of the flash memory cells 174 and 176 has attained approximately the second program verify level for the respective threshold voltage. Because the change in threshold voltage to each of the cells 170, 172, 174, and 176 during the second pass is relatively small, the effect on the threshold voltage from FG—FG coupling is negligible. For example, after the first pass, the flash memory cells 170, 172, 174, and 176 attained threshold voltages of 2.65 Volts, 2.2 Volts, 3.2 Volts, and 3.2 Volts, respectively. Thus, after performing the second pass of steps 510, 512, and 514 for the first or second program verify levels of 3.0 Volts, 3.0 Volts, 4.0 Volts, and 4.0 Volts for the cells 170, 172, 174, and 176, respectively, the threshold voltages of the flash memory cells 170, 172, 174, and 176 change by 0.35 Volts, 0.8 Volts, 0.8 Volts, and 0.8 Volts, respectively.

The effect on a threshold voltage of a flash memory cell from FG—FG coupling depends on the change in threshold voltage of a programmed adjacent flash memory cell. With such small changes of 0.35 Volts and 0.8 Volts, the FG—FG coupling is negligible such that each of the flash memory cells 170, 172, 174, and 176 attains threshold voltages of about 3.0 Volts, 3.0 Volts, 4.0 Volts, and 4.0 Volts, respectively, after the second pass of steps 510, 512, and 514.

In this manner, a first pass of program verify and programming steps 504, 506, and 508 are performed for relatively large percentages, Y % and Z %, of the first and second program verify levels, respectively. Thus, any significant change to the threshold voltage from programming of an adjacent flash memory cell occurs during the first pass. Yet, Y % and Z % are selected such that (100%–Y %) of the first program verify level and (100%–Z %) of the second program verify level are each a maximum potential change to a threshold voltage of a flash memory cell from programming any adjacent flash memory cells to the larger of the first or second program verify levels. Thus, none of the flash memory cells 170, 172, 174, and 176 initially passes program verify after the first pass and at the beginning of the second pass.

After such a first pass, the second pass of program verify and programming steps 510, 512, and 514 are performed for "fine-tuning" the threshold voltage of each of the flash memory cells 170, 172, 174, and 176 to the first or second program verify levels. In addition, FG—FG coupling from incrementally small changes to the threshold voltage with such fine-tuning is negligible such that each of the flash memory cells 170, 172, 174, and 176 attains substantially the first or second program verify levels.

The foregoing is by way of example only and is not intended to be limiting. For example, the present invention is described in reference to the example group of flash memory cells 170, 172, 174, and 176 to be programmed. However, the steps of FIGS. 8, 9, or 10 of the present invention may be used for programming a group of any flash memory cells of a page, as would be apparent to one of ordinary skill in the art of flash memory technology from the description herein.

In addition, the present invention may be practiced with various implementations of the components 302, 304, 306, 308, 310, 312, 314, 316, and 318 of FIG. 7 such as by hardware and/or software for performing the functions described herein. Furthermore, any numbers as stated, described, or illustrated herein are by way of example only. Additionally, the multi-pass mechanism as described and illustrated herein may be applied to any floating gate memory technology, whether implemented in NOR, NAND, or AND architecture for example, to reduce the effects of FG—FG coupling. The present invention is limited only as defined in the following claims and equivalents thereof.

We claim:

1. A method for programming a group of at least one flash memory cell of an array, comprising:
   A. performing a first pass of program verify and programming steps until each flash memory cell of the group attains a threshold voltage that is at least X % of a program verify level but less than the program verify level after the first pass is completed; and
   B. performing, after the first pass is completed, a second pass of program verify and programming steps until each flash memory cell of the group attains substantially the program verify level,
   wherein (100%–X %) of the program verify level is at least a maximum potential change to a threshold voltage of a flash memory cell from programming any adjacent flash memory cells to the program verify level.

2. The method of claim 1, wherein the step A comprises a loop of the following steps:
   determining whether a flash memory cell of the group has not attained substantially X % of the program verify level, during the program verify step; and
   generating a programming pulse for the flash memory cell of the group that has not attained substantially X % of the program verify level, during the programming step.

3. The method of claim 1, wherein the step B comprises a loop of the following steps:
   determining whether a flash memory cell of the group has not attained substantially the program verify level, during the program verify step; and
   generating a programming pulse for the flash memory cell of the group that has not attained the program verify level, during the programming step.

4. The method of claim 1, wherein the group includes a plurality of flash memory cells to be programmed to multi-level threshold voltages, the method further comprising:
   performing the first pass of program verify and programming steps until each flash memory cell of a first sub-group of the group attains a threshold voltage that is at least Y % of a first program verify level but less than the first program verify level, and until each flash memory cell of a second sub-group of the group attains a threshold voltage that is at least Z % of a second program verify level but less than the second program verify level; and performing the second pass of program verify and programming steps until each flash memory cell of the first sub-group attains substantially the first program verify level, and until each flash memory cell of the second sub-group attains substantially the second program verify level, wherein (100%–Y %) of the first program verify level and (100%–Z %) of the second program verify level are each at least a maximum potential change to a threshold voltage of a flash memory cell from programming any adjacent flash memory cells to a higher of the first and second program verify levels.

5. The method of claim 4, wherein (100%–Y %) of the first program verify level and (100%–Z %) of the second program verify level are each a maximum potential change to a threshold voltage of a flash memory cell from programming any adjacent flash memory cells to a higher of the first and second program verify levels.

6. The method of claim 1, wherein (100%–X %) of the program verify level is a maximum potential change to a threshold voltage of a flash memory cell from programming any adjacent flash memory cells to the program verify level.

7. The method of claim 1, wherein the at least one flash memory cell of the group is contained within a page of the array.

8. The method of claim 7, wherein the page of the array is situated between $V_{SS}$ (source bias voltage) lines and between drain bit line junctions.

9. The method of claim 1, further comprising:
storing a respective address of each flash memory cell of the group in a page buffer.

10. A system for programming a group of at least one flash memory cell of an array, comprising:
means for performing a first pass of program verify and programming steps until each flash memory cell of the group attains a threshold voltage that is at least X % of a program verify level but less than the program verify level after the first pass is completed; and
means for performing, after the first pass is completed, a second pass of program verify and programming steps until each flash memory cell of the group attains substantially the program verify level,
wherein (100%–X %) of the program verify level is at least a maximum potential change to a threshold voltage of a flash memory cell from programming any adjacent flash memory cells to the program verify level.

11. The system of claim 10, wherein the means for performing the first pass comprises:
means for determining whether a flash memory cell of the group has not attained substantially X % of the program verify level, during the program verify step; and
means for generating a programming pulse for the flash memory cell of the group that has not attained substantially X % of the program verify level, during the programming step.

12. The system of claim 10, wherein the means for performing the second pass comprises:
means for determining whether a flash memory cell of the group has not attained substantially the program verify level, during the program verify step; and
means for generating a programming pulse for the flash memory cell of the group that has not attained the program verify level, during the programming step.

13. The system of claim 10, wherein the group includes a plurality of flash memory cells to be programmed to multi-level threshold voltages, the system further comprising:
means for performing the first pass of program verify and programming steps until each flash memory cell of a first sub-group of the group attains a threshold voltage that is at least Y % of a first program verify level but less than the first program verify level, and until each flash memory cell of a second sub-group of the group attains a threshold voltage that is at least Z % of a second program verify level but less than the second program verify level; and
means for performing the second pass of program verify and programming steps until each flash memory cell of the first sub-group attains substantially the first program verify level, and until each flash memory cell of the second sub-group attains substantially the second program verify level,
wherein (100%–Y %) of the first program verify level and (100%–Z %) of the second program verify level are each at least a maximum potential change to a threshold voltage of a flash memory cell from programming any adjacent flash memory cells to a higher of the first and second program verify levels.

14. The system of claim 13, wherein (100%–Y %) of the first program verify level and (100%–Z %) of the second program verify level are each a maximum potential change to a threshold voltage of a flash memory cell from programming any adjacent flash memory cells to a higher of the first and second program verify levels.

15. The system of claim 10, wherein (100%–X %) of the program verify level is a maximum potential change to a threshold voltage of a flash memory cell from programming any adjacent flash memory cells to the program verify level.

16. The system of claim 10, wherein the at least one flash memory cell of the group is contained within a page of the array.

17. The system of claim 16, wherein the page of the array is situated between $V_{SS}$ (source bias voltage) lines and between drain bit line junctions.

18. The system of claim 10, further comprising:
a page buffer for storing a respective address of each flash memory cell of the group.

* * * * *